US006122383A

United States Patent [19]

Berge

[11] Patent Number: 6,122,383

[45] **Date of Patent: *Sep. 19, 2000**

[54] DEVICE FOR REDUCING NOISE

[75] Inventor: Wolfgang zum Berge, Walsrode, Germany

[73] Assignee: Sennheiser electronic KG, Wedemark, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/630,717

[22] Filed: Apr. 8, 1996

[30] Foreign Application Priority Data

Apr. 7, 1995 [DE] Germany ............................ 195 13 111

[51] Int. Cl.[7] ............................ H03B 29/00; H04R 25/00

[52] U.S. Cl. ........................... 381/71.6; 381/72; 381/367; 381/375; 181/158

[58] Field of Search ................................. 381/71, 94, 72, 381/74, 96, 150, 183, 187, 189, 92, 168, 169, 370, 372, 374, 375, 355, 359, 367, 369; 181/158, 166

[56] References Cited

U.S. PATENT DOCUMENTS

| | | | |
|---|---|---|---|
| 4,494,074 | 1/1985 | Bose | 330/109 |
| 4,644,581 | 2/1987 | Sapiejewski | 381/74 |
| 4,887,693 | 12/1989 | Plice | 381/189 |
| 4,922,542 | 5/1990 | Sapiejewski | 381/372 |
| 4,975,966 | 12/1990 | Sapiejewski | 381/189 |
| 5,182,774 | 1/1993 | Bourk | 381/72 |
| 5,329,593 | 7/1994 | Lazzeroni et al. | 381/168 |
| 5,349,140 | 9/1994 | Valenzin | 381/189 |
| 5,365,595 | 11/1994 | Li | 381/189 |
| 5,375,174 | 12/1994 | Denenberg | 381/71.6 |
| 5,381,485 | 1/1995 | Eliott | 381/71.6 |
| 5,410,608 | 4/1995 | Lucey et al. | 381/169 |
| 5,452,361 | 9/1995 | Jones | 381/71.6 |
| 5,615,273 | 3/1997 | Lucey et al. | 381/169 |
| 5,673,330 | 9/1997 | Chang | 381/168 |

FOREIGN PATENT DOCUMENTS

| | | | |
|---|---|---|---|
| 0390386 | 10/1990 | European Pat. Off. | 381/71 |
| 0412902 | of 1990 | European Pat. Off. . | |
| 0590869 | of 1993 | European Pat. Off. . | |

*Primary Examiner*—Curtis A. Kuntz
*Assistant Examiner*—Xu Mei
*Attorney, Agent, or Firm*—McAulay Nissen Goldberg Kiel & Hand, LLP

[57] ABSTRACT

A device is provided for reducing noise in the human ear having a microphone which picks up the noise and a reproduction transducer to which a noise compensation signal is fed via a compensation circuit which is connected with the microphone. The microphone in the device has a balancing element which is arranged in front of the sound entrance opening of the microphone. The balancing element defines a quasi-constant sound reflection and accordingly reduces individual reflection effects caused by the fundamental diversity of the external region of the human ear and improves the use of the entire device and increases the effectiveness of the noise compensation overall. In this way, headphones/hearing protectors can also be designed as acoustically closed systems which are designed so as to rest on the ear.

7 Claims, 3 Drawing Sheets

DEVICE FOR REDUCING NOISE

BACKGROUND OF THE INVENTION a) Field of the Invention

The invention is directed to a device for reducing noise in the human ear having a microphone which picks up the noise and a reproduction transducer to which a noise compensation signal is fed via a compensation circuit which is connected with the microphone.

b) Description of the Related Art

A device of this kind is known from DE-42 00 811-C2. The known device has a headphone with acoustically closed earpieces or shells surrounding the ear. The microphone for picking up noise is arranged upstream of the reproduction transducer so as to be offset relative to the principal center axis of the reproduction transducer. The noise picked up by the microphone is first fed to an amplifier, then filtered and then fed again with amplification to the reproduction transducer which excites a noise signal which is in opposite phase to the noise.

However, the known device does not always operate satisfactorily under certain conditions. For example, the ear-surrounding shape of the headphone results in poor ventilation for the ear which promotes perspiration in the region covered by the headphone, especially since the headphone contacts with a relatively high contact pressure. As a result, the known device is uncomfortable to wear and inconvenient to use.

On the other hand, every human ear, and the external ear region in particular, has a unique shape like human fingerprints. Accordingly, conditions with respect to sound reflection and sound volume will be different for every human ear. As a result, a compensation regulating circuit which has been tuned once to an average ear reflection behavior and sound volume often operates in a less-than-optimal state when used.

OBJECT AND SUMMARY OF THE INVENTION

The primary object of the present invention is to improve the known device generally and, in particular, as to the limitations mentioned above.

This object is met according to the invention by a device for reducing noise in the human ear which has a microphone which picks up sound and a reproduction transducer to which a signal which compensates for the noise is fed via a compensation circuit which is connected with the microphone and in which the microphone has a balancing element which is arranged upstream of the sound entrance opening of the microphone.

A balancing element of this kind balances the external-ear reflections which differ from one ear to the other and in this way defines a quasi-constant sound reflection and accordingly reduces individual reflection effects in the compensation circuit and improves the use of the device overall and increases the total effectiveness of the noise compensation. Accordingly, with increased contact pressure of the device according to the invention, the circular or circuit amplification of the compensation circuit increases less than in a device without a reflector and the stability of the control loop or regulating circuit is also ensured as the contact pressure of the headphone increases.

It has been found that the reduction of reflection effects is achieved in a satisfactory manner if the microphone and the compensation transducer are both aligned to the ear and preferably lie centrally on an axis of symmetry, e.g., the axis of rotational symmetry, as is shown in FIG. 1*a*.

The balancing element is advisably formed by a circular plate having projections for receiving the microphone which are directed toward the transducer. This enables the microphone to be positioned with respect to the balancing element.

Further, in a headphone/hearing protector with a device according to the invention, the headphone advantageously does not enclose the ear, but rather is designed so as to rest on the ear resulting in a smaller overall size and a considerably reduced weight of the headphone. In spite of the reduced contact pressure of the headphone compared with the known device, the noise reduction is sufficient and is even improved compared with the known device. The wearing comfort of a headphone/hearing protector designed in this way is greatly improved compared with the known device, especially since the weight of the headphones can be reduced by approximately 50% compared to the known headphone.

The invention will be described more fully in the following with reference to an embodiment example shown in the drawings.

DESCRIPTION OF THE PREFERRED EMBODIMENTS

Figure 1A:
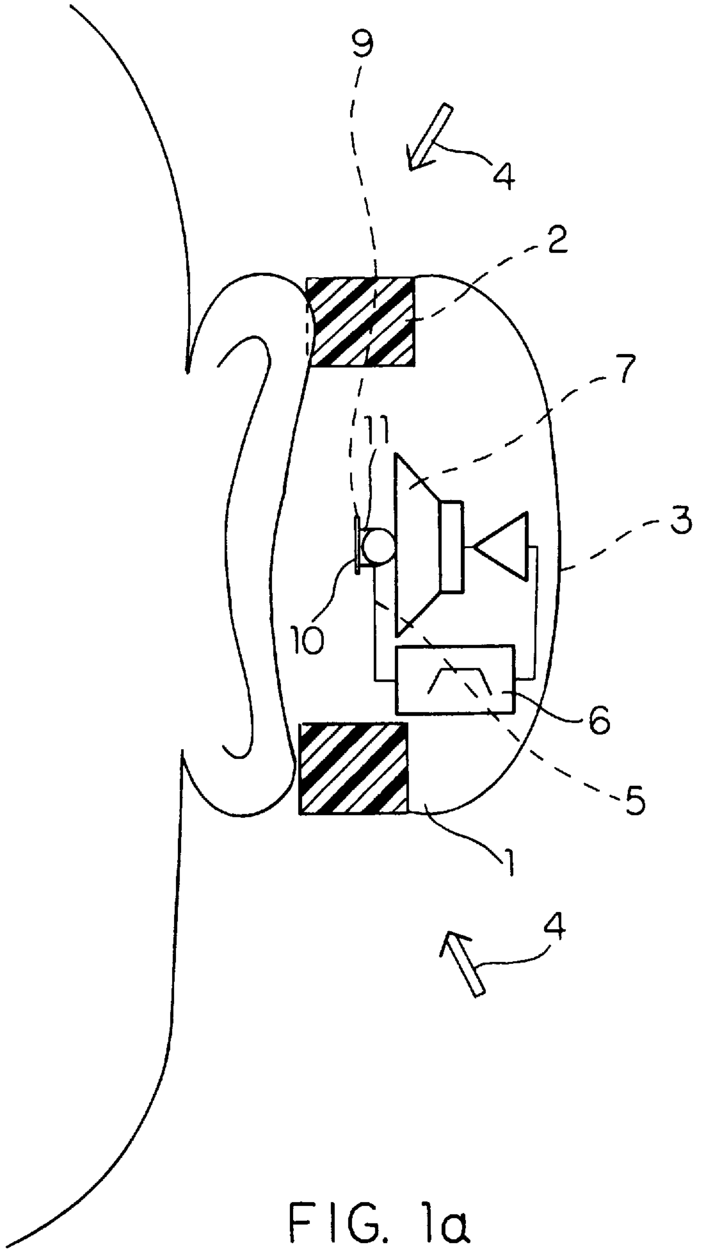
FIG. 1*a*–1*c* show a cross section through a headphone resting on the ear with a device according to the invention for reducing noise in the human ear.

FIG. 1*a* shows a part of a headphone I resting on the ear with an acoustically closed ear cushion 2 and shell 3. The noise 4 reaching the ear is picked up by a microphone 5 which transmits the received signal to a compensation circuit 6 which, for the purpose of noise compensation, feeds a signal to a reproduction transducer 7 which excites the noise-compensating signal.

The microphone 5 has a sound entrance opening 8 which is covered by a balancing element 9. Both the reproduction transducer 7 and the microphone 5 are aligned in the direction of the human ear 10 so that the balancing element 9, microphone 5, and reproduction transducer 7 share a common axis of symmetry which is preferably the rotational axis.

Figure 1C:
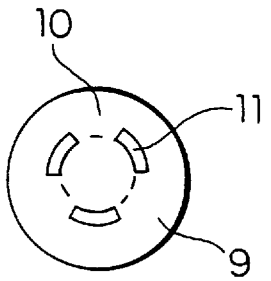
Figure 1B:
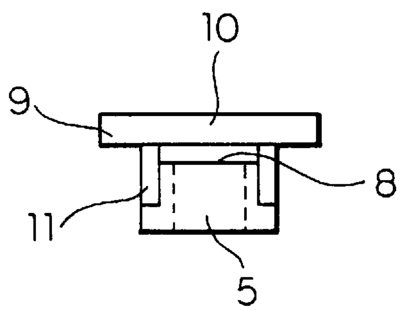

As is shown in FIGS. 1*b* and 1*c*, the balancing element 9 is formed of a plate 10 which has projections 11 directed to the reproduction transducer. The distance between the plate 10 of the balancing element and the sound entrance opening of the microphone is approximately 1 to 3 mm. The plate 10 is circular and has a diameter of approximately 0.5 to 3 cm, preferably approximately 1.5 cm, and is formed of plastic.

The microphone is received by a sleeve with a circumferential bead and the front portion of the sleeve fits into the region between the projections 11 of the balancing element 9 until the circumferential bead contacts the projections. Accordingly, the position of the microphone is completely defined with respect to the balancing element 9.

Reflections from the external portion of the human ear which differ from one person to the next because of the unique individual shapes of the external human ear travel through the balancing element to the microphone in a defined magnitude and are converted in the microphone into a corresponding electric signal. Due to the sound reflection defined by the balancing element, the circuit amplification of the compensation circuit shown in FIG. 3 increases less than it would in the absence of the reflector when the contact pressure is increased. Thus, due to the balancing element, the stability of the regulating circuit of the compensation circuit is also ensured when the contact pressure of the headphone increases.

Figure 2:
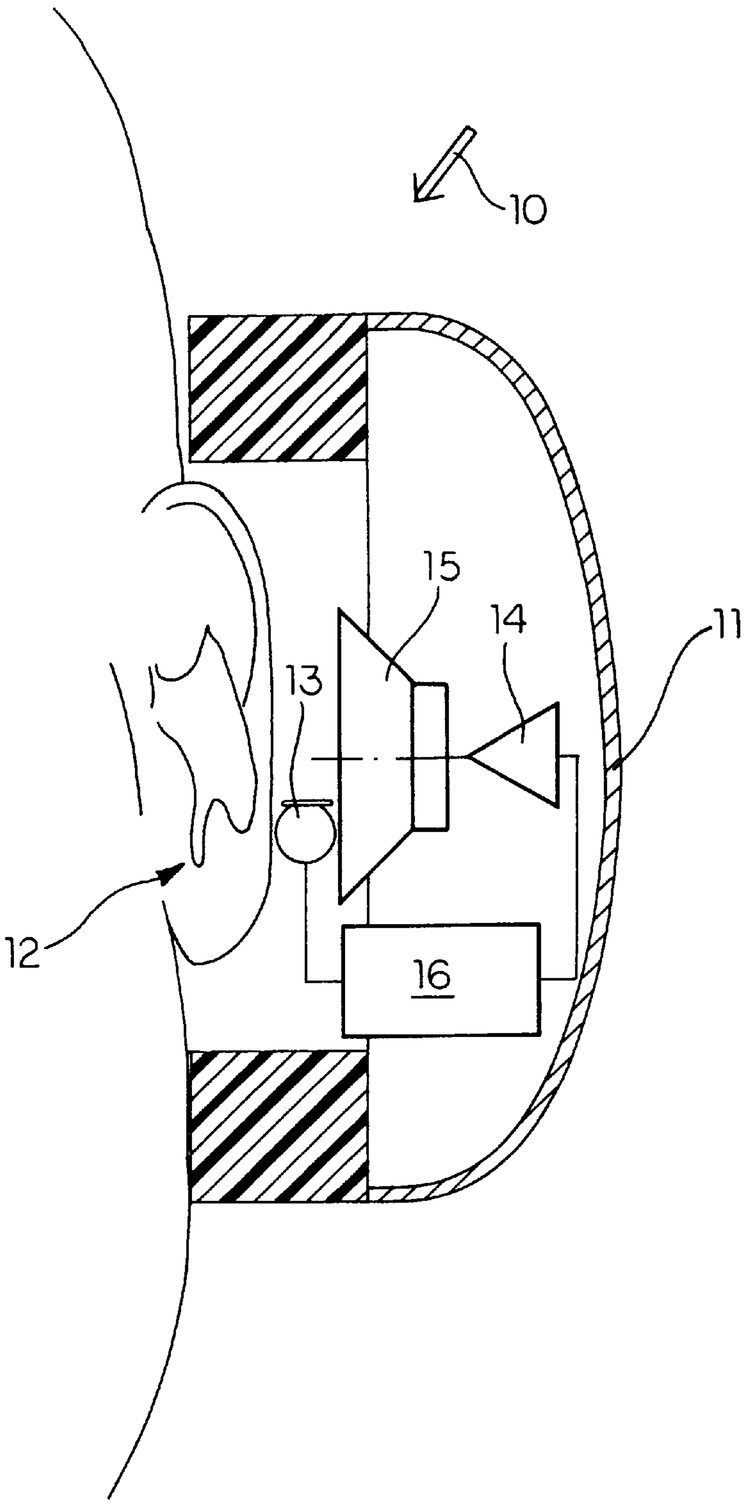
FIG. 2 shows a cross section through a headphone with a known device for reducing noise.

Since the headphone/hearing protector according to the invention is designed so as to rest on the ear, a considerably smaller surface of the human ear is covered than in the case of an ear-surrounding shape as is shown in FIG. 2. Accordingly, perspiration is substantially reduced compared with the headphone shape shown in FIG. 2 and the smaller overall size of the construction which rests on the ear also drastically reduces the total weight of the headphone/hearing protector and accordingly contributes on the whole to increased wearing comfort. Further, the construction which rests on the ear, as is shown in FIG. 1, makes do with a relatively small contact pressure force of roughly 3.5 newtons, which further increases wearing comfort compared with the known device shown in FIG. 2 in which the contact pressure force is approximately 10 newtons.

The structural component parts in FIG. 2 which are identical to those in FIG. 1 are designated by the same reference numbers. The microphone 5 in the known device is arranged upstream of the reproduction transducer so as to be offset by 90° with respect to the principal axis of the reproduction transducer. The sound entrance opening is not covered in the microphone shown in FIG. 2. Further, the headphone shown in FIG. 2 is an ear-surrounding headphone whose contact pressure force must amount to roughly 10 newtons, that is, roughly three-times that of the headphone according to the invention which is shown in FIG. 1. Moreover, the headphone shown in FIG. 2 is roughly twice as heavy as the headphone shown in FIG. 1 which weighs approximately 180 g.

The device shown in FIG. 2 has very defined ratios because of the defined headphone volume. The individual shaped portions of the external ear have hardly any influence on the overall regulating behavior.

In contrast, the sound volume in the device for noise compensation shown in FIG. 1 is relatively undefined compared to the device shown in FIG. 2 due to the consider ably reduced contact pressure and the design which rests on the ear, the shape of the external ear having a relatively large influence on this sound volume. If the balancing element in the device shown in FIG. 1 were omitted, an effective noise reduction would no longer be possible because the regulating circuit of the noise compensation circuit could not be kept stable. The necessary stable ratios for the compensation circuit are only brought about by the balancing element serving as reflecting element. For this purpose, the balancing element provides for an interference which is sufficiently strong, but so defined that the different external ear shapes can no longer have an effect on the circuit amplification.

Figure 3:
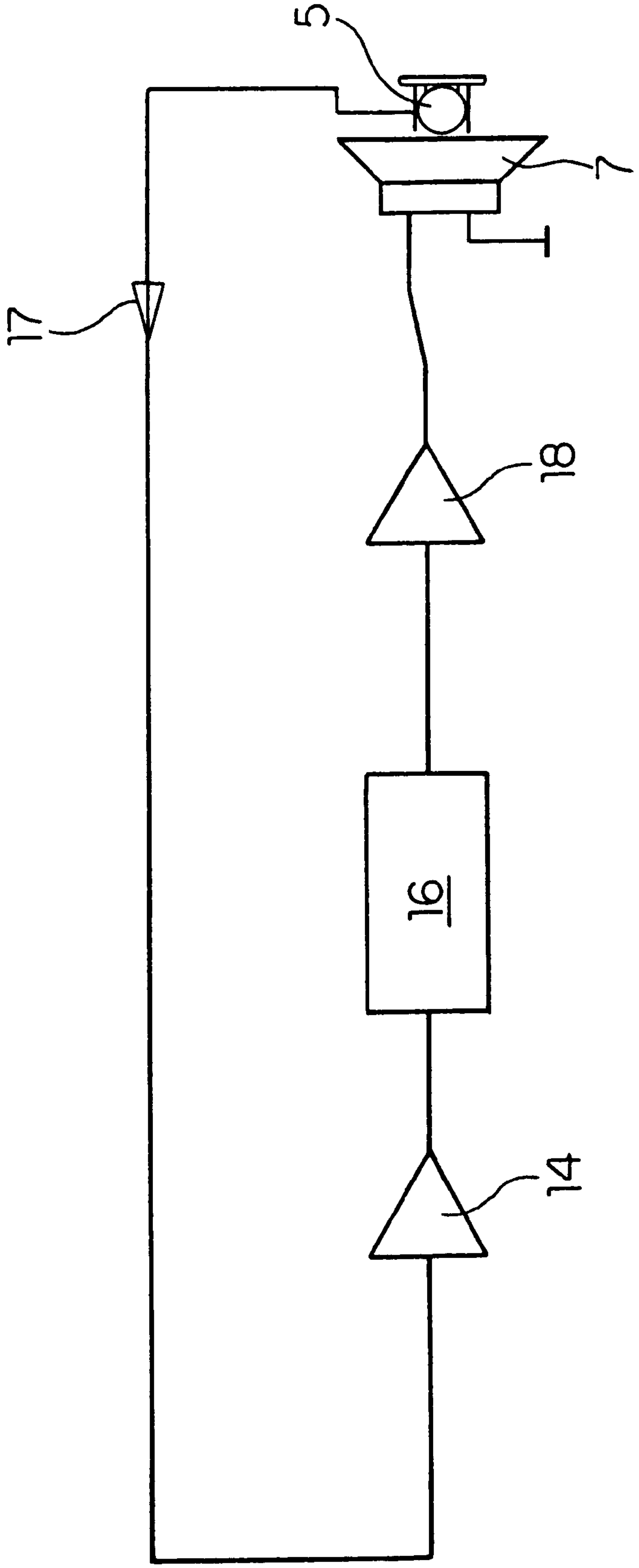
FIG. 3 shows a block diagram of the electrical components of the device for reducing noise in the human ear.

In principle, the compensation circuit for the device according to the invention is constructed as shown in FIG. 3, which construction is substantially known from DE-4200811. The output signal 17 generated by the microphone 5 is pre-amplified by a first amplifier 14, weighted in a filter 16, and then amplified in another amplifier 18 in such a way that the reproduction transducer 7 is excited in the opposite phase.

While the foregoing description and drawings represent the preferred embodiments of the present invention, it will be obvious to those skilled in the art that various changes and modifications may be made therein without departing from the true spirit and scope of the present invention.

What is claimed is:

1. A device for reducing noise in the human ear comprising:

a microphone for picking up noise, said microphone having a sound entrance opening;

a compensation circuit coupled to said microphone and providing a noise compensation signal;

a reproduction transducer to which said noise compensation signal is fed; and, a balancing element for reducing the effect of reflections at the ear, said balancing element comprising:

a plate and projections, said projections being directed toward said microphone for receiving said microphone and positioning said plate over the sound entrance of the microphone.

2. The device according to claim 1, wherein said plate is circular and has a diameter of approximately 0.5 to 3 cm.

3. The device according to claim 2, wherein said plate has a diameter of approximately 1.5 cm.

4. The device according to claim 1, wherein the balancing element and plate are formed of plastic.

5. A device for reducing noise in the human ear comprising:

a microphone for picking up noise, said microphone having a sound entrance opening directed toward the ear;

a compensation circuit coupled to said microphone and providing a noise compensation signal;

a reproduction transducer to which said noise compensation signal is fed; and a balancing element for reducing the effect of reflections at the ear, said balancing element being positioned over the sound entrance opening of the microphone.

6. The device according to claim 5, wherein said microphone and said reproduction transducer are aligned in the same direction, said microphone, said transducer and said balancing element each having a center axis, said center axes being aligned.

7. A headphone/hearing protector comprising:

a device for reducing noise, said device for removing noise having;

a microphone for picking up noise, said microphone having a sound entrance opening;

a compensation circuit coupled to said microphone and providing a noise compensation signal;

a reproduction transducer to which said noise compensation signal is fed; and a balancing element for reducing the effect of reflections at the ear, the balancing element being positioned over the sound entrance of the microphone;

wherein said headphone/hearing protector has an acoustically closed system which is shaped so as to rest on the ear.

* * * * *